United States Patent
Han et al.

(10) Patent No.: US 12,354,524 B2
(45) Date of Patent: Jul. 8, 2025

(54) DISPLAY DEVICE AND DISPLAY PANEL

(71) Applicant: LG DISPLAY CO., LTD., Seoul (KR)

(72) Inventors: Minji Han, Gyeonggi-do (KR); Soohoon Ham, Gyeonggi-do (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 18/386,094

(22) Filed: Nov. 1, 2023

(65) Prior Publication Data
US 2024/0203318 A1 Jun. 20, 2024

(30) Foreign Application Priority Data
Dec. 15, 2022 (KR) .................. 10-2022-0175821

(51) Int. Cl.
*G09G 3/20* (2006.01)
*G09G 3/3233* (2016.01)
*H10K 59/131* (2023.01)
*H10K 102/00* (2023.01)

(52) U.S. Cl.
CPC ......... *G09G 3/2096* (2013.01); *G09G 3/3233* (2013.01); *H10K 59/131* (2023.02); *G09G 2300/0819* (2013.01); *G09G 2300/0842* (2013.01); *G09G 2320/0233* (2013.01); *G09G 2320/0247* (2013.01); *G09G 2370/00* (2013.01); *H10K 2102/311* (2023.02)

(58) Field of Classification Search
CPC .............. G09G 3/3233; G09G 3/2096; G09G 2300/0842; G09G 2300/0819; G09G 2370/00; G09G 2320/0247; G09G 2320/0233; H10K 59/131; H10K 2102/311
See application file for complete search history.

(56) References Cited

U.S. PATENT DOCUMENTS

| | | | |
|---|---|---|---|
| 11,515,383 B2* | 11/2022 | Son | H10K 59/123 |
| 11,521,545 B2* | 12/2022 | Cho | G09G 3/3225 |
| 11,800,763 B2* | 10/2023 | Son | H10K 59/88 |
| 11,957,034 B2* | 4/2024 | Jeong | G09G 3/2092 |
| 12,020,616 B2* | 6/2024 | Dong | H10K 59/131 |

(Continued)

FOREIGN PATENT DOCUMENTS

| | | |
|---|---|---|
| CN | 113053288 A | 6/2021 |
| WO | 2018/062023 A1 | 4/2018 |

OTHER PUBLICATIONS

Office Action issued on Aug. 22, 2024 for Japanese Patent Application No. 2023-192794.

(Continued)

*Primary Examiner* — Doon Y Chow
(74) *Attorney, Agent, or Firm* — Morgan, Lewis & Bockius LLP

(57) ABSTRACT

Embodiments of the disclosure relate to a display device and a display panel. A display panel includes a plurality of subpixels, a plurality of data lines comprising a first data line group disposed in a first area corresponding to a data driving circuit and a second data line group disposed in a second area located on outside of the first area, a plurality of gate lines, a first data link line group having a linear structure connected to the first data line group and disposed in a bezel area, and a second data link line group having a bending structure in which (2-3)th data link lines having the same length are connected to the second data line group through a display area.

22 Claims, 12 Drawing Sheets

(56) References Cited

U.S. PATENT DOCUMENTS

| | | |
|---|---|---|
| 12,035,595 B2* | 7/2024 | Cho ................. H10K 59/126 |
| 2019/0278145 A1 | 9/2019 | Tanaka et al. |
| 2021/0201736 A1 | 7/2021 | You et al. |
| 2024/0203364 A1* | 6/2024 | Park ................. G09G 3/3291 |

OTHER PUBLICATIONS

Office Action issued on Jan. 15, 2025 for Taiwanese Patent Application No. 112145168. Note: US 2019/0278145A1 cited therein is already of record.

* cited by examiner (a)

(b)

DISPLAY DEVICE AND DISPLAY PANEL

CROSS REFERENCE TO RELATED APPLICATION

This application claims priority from Korean Patent Application No. 10-2022-0175821, filed on Dec. 15, 2022, which is hereby incorporated by reference for all purposes as if fully set forth herein.

BACKGROUND

Technical Field

Embodiments relate to a display device and a display panel and, more particularly, to a display device and a display panel capable of implementing a narrow bezel and improving image quality by forming the same length of horizontal data link lines disposed in the display area of the display panel.

Discussion of the Related Art

In response to the development of the information society, a variety of demands for image display devices are increasing. In this regard, a range of display devices, such as liquid crystal display (LCD) devices and organic light-emitting display devices, have recently come into widespread use.

Among such display devices, organic light-emitting display devices are advantageous in terms of rapid response rates, high contrast ratios, high emission efficiency, high luminance, wide viewing angles, and the like, since organic light-emitting diodes emitting light by themselves are used therein.

Such an organic light-emitting display device may include organic light-emitting diodes (OLEDs) disposed in a plurality of subpixels arrayed in a display panel, and may control the OLEDs to emit light by controlling current flowing through the OLEDs, thereby displaying an image while controlling the luminance of the subpixels.

In such display devices, research into minimizing the width of the bezel formed outside a display area is being actively undertaken in order to reduce the overall weight and size of a display device and to make the appearance of the display device more aesthetically appealing.

SUMMARY

Accordingly, embodiments of the present disclosure are directed to a display device and a display panel that substantially obviate one or more of the problems due to limitations and disadvantages of the related art.

An aspect of the present disclosure is to provide a display device and a display panel capable of implementing a narrow bezel and improving image quality by forming horizontal data link lines of the same length in the display area of the display panel.

Another aspect of the present disclosure is to a display device and a display panel capable of implementing a narrow bezel and improving image quality by forming a structure which data lines disposed in a first area corresponding to a data driving circuit may be connected to a first data link line group having a linear structure and data lines disposed in a second area corresponding to a location outside the first area may be connected to a second data link line group having a bending structure including horizontal data link lines of the same length.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a display panel including a plurality of subpixels, a plurality of data lines, and a plurality of gate lines, a data driving circuit configured to supply a plurality of data voltages to the plurality of data lines, a gate driving circuit configured to supply a plurality of gate signals to the plurality of gate lines, a timing controller configured to control the data driving circuit and the gate driving circuit, wherein the display panel includes a first data link line group with a linear structure connecting to a first data line group disposed in a first area corresponding to the data driving circuit among the plurality of data lines, and a second data link line group with a bending structure connecting to a second data line group disposed in a second area located on outside of the first area among the plurality of data lines through (2-3)th data link lines with same length.

In another aspect, a display panel comprises a plurality of subpixels, a plurality of data lines comprising a first data line group disposed in a first area corresponding to a data driving circuit and a second data line group disposed in a second area located on outside of the first area, a plurality of gate lines, a first data link line group having a linear structure connected to the first data line group and disposed in a bezel area, and a second data link line group having a bending structure in which (2-3)th data link lines having the same length are connected to the second data line group through a display area.

According to embodiments, the display device and the display panel may implement a narrow bezel and improve the image quality.

According to embodiments, the display device and the display panel may implement a narrow bezel and improve image quality by forming horizontal data link lines of the same length in the display area of the display panel.

According to embodiments, the display device and the display panel may implement a narrow bezel and improve image quality by forming a structure which data lines disposed in a first area corresponding to a data driving circuit may be connected to a first data link line group having a linear structure and data lines disposed in a second area corresponding to a location outside the first area may be connected to a second data link line group having a bending structure including horizontal data link lines of the same length.

In another aspect, a display device comprises: a display panel including a plurality of subpixels, a plurality of data lines, and a plurality of gate lines; a data driving circuit configured to supply a plurality of data voltages to the plurality of data lines; a gate driving circuit configured to supply a plurality of gate signals to the plurality of gate lines; a timing controller configured to control the data driving circuit and the gate driving circuit; wherein the display panel includes: a first data link line group with a linear structure connecting to a first data line group disposed in a first area corresponding to the data driving circuit among the plurality of data lines; and a second data link line group connecting to a second data line group disposed in a second area located on outside of the first area among the plurality of data lines, the second data link line group comprising data link lines disposed in a first direction in the first area and data link lines extending in a second direction perpendicular to the first direction with same length.

It is to be understood that both the foregoing general description and the following detailed description are exemplary and explanatory and are intended to provide further explanation of the inventive concepts as claimed

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
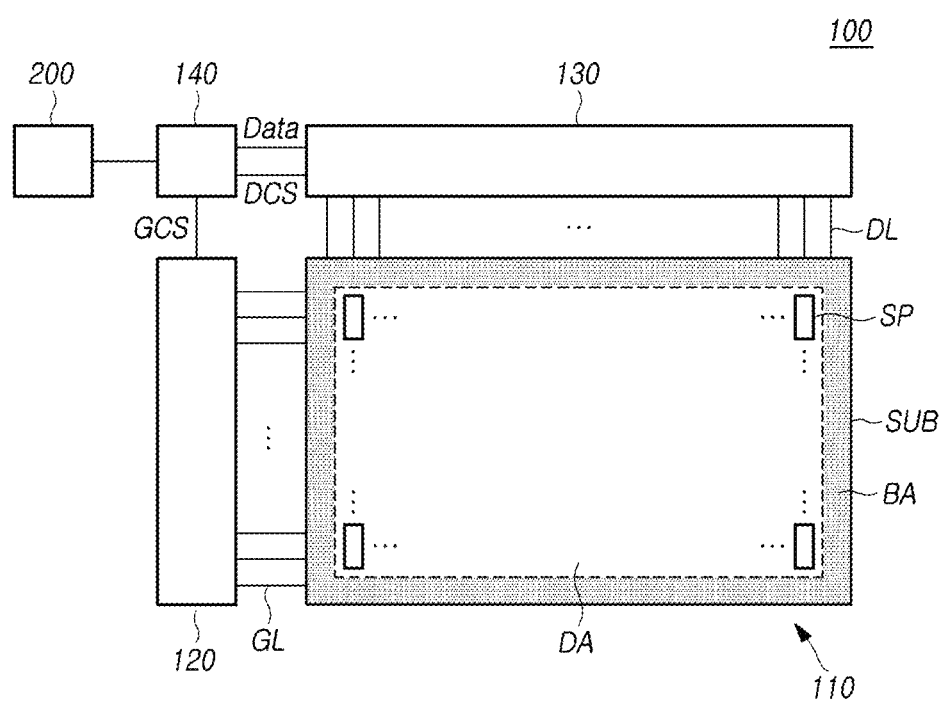
FIG. 1 is a diagram schematically illustrating a display device according to embodiments.

Hereinafter, some embodiments of the present disclosure will be described in detail with reference to exemplary drawings. In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings. Further, in the following description of examples or embodiments of the present invention, detailed descriptions of well-known functions and components incorporated herein will be omitted when it is determined that the description may make the subject matter in some embodiments the present invention rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a diagram schematically illustrating a display device according to embodiments.

Referring to FIG. 1, a display device 100 according to embodiments may include a display panel 110 and a driving circuit for driving the display panel 110.

The display panel 110 may include a display area DA on which images are displayed and a bezel area BA on which no images are displayed. The bezel area BA may also be referred to as a non-display area.

The display panel 110 may include a plurality of subpixels SP to display images. For example, the plurality of subpixels SP may be disposed in the display area DA. In some cases, at least one subpixel SP may be disposed in the bezel area BA. The at least one subpixel SP disposed in the bezel area BA is referred to as a dummy subpixel.

The display panel 110 may include a plurality of signal lines to drive the plurality of subpixels SP. For example, the plurality of signal lines may include a plurality of data lines DL and a plurality of gate lines GL. The signal lines may further include other signal lines than the plurality of data lines DL and the plurality of gate lines GL according to the structure of the subpixels SP. For example, the other signal lines may include driving voltage lines, reference voltage lines, and the like.

The plurality of data lines DL may intersect the plurality of gate lines GL. Each of the plurality of data lines DL may be disposed to extend in a first direction. Each of the plurality of gate lines GL may be disposed to extend in a second direction. Here, the first direction may be a column direction, while the second direction may be a row direction. In this specification, the column direction and the row direction are relative terms. In an example, the column direction may be a vertical direction, while the row direction may be a horizontal direction. In another example, the column direction may be a horizontal direction, while the row direction may be a vertical direction.

The driving circuit may include a data driving circuit 130 to drive the plurality of data lines DL and a gate driving circuit 120 to drive the plurality of gate lines GL. The driving circuit may further include a timing controller 140 to control the data driving circuit 130 and the gate driving circuit 120.

The data driving circuit 130 is a circuit to drive the plurality of data lines DL, and may output data signals (also referred to as data voltages) corresponding to an image signal to the plurality of data lines DL. The gate driving circuit 120 is a circuit to drive the plurality of gate lines GL, and may generate gate signals and output the gate signals to the plurality of gate lines GL. The gate signals may include one or more scan signals and an emission signal.

The timing controller 140 may start scanning in timing set for respective frames and control data driving at appropriate points in time in response to the scanning. The timing controller 140 may convert image data input from an external source into image data Data having a data signal format readable by the data driving circuit 130 and output the image data Data to the data driving circuit 130.

The timing controller 140 may receive display drive control signals together with the input image data from a host system 200. For example, the display drive control signals may include a vertical synchronization signal, a horizontal synchronization signal, an input data enable signal, a clock signal, and the like.

The timing controller 140 may generate a data drive control signal DCS and a gate drive control signal GCS on the basis of the display drive control signals input from the host system 200. The timing controller 140 may control the drive operation and the drive timing of the data driving circuit 130 by supplying the data drive control signal DCS to the data driving circuit 130. The timing controller 140 may control the drive operation and the drive timing of the gate driving circuit 120 by supplying the gate drive control signal GCS to the gate driving circuit 120.

Figure 2:
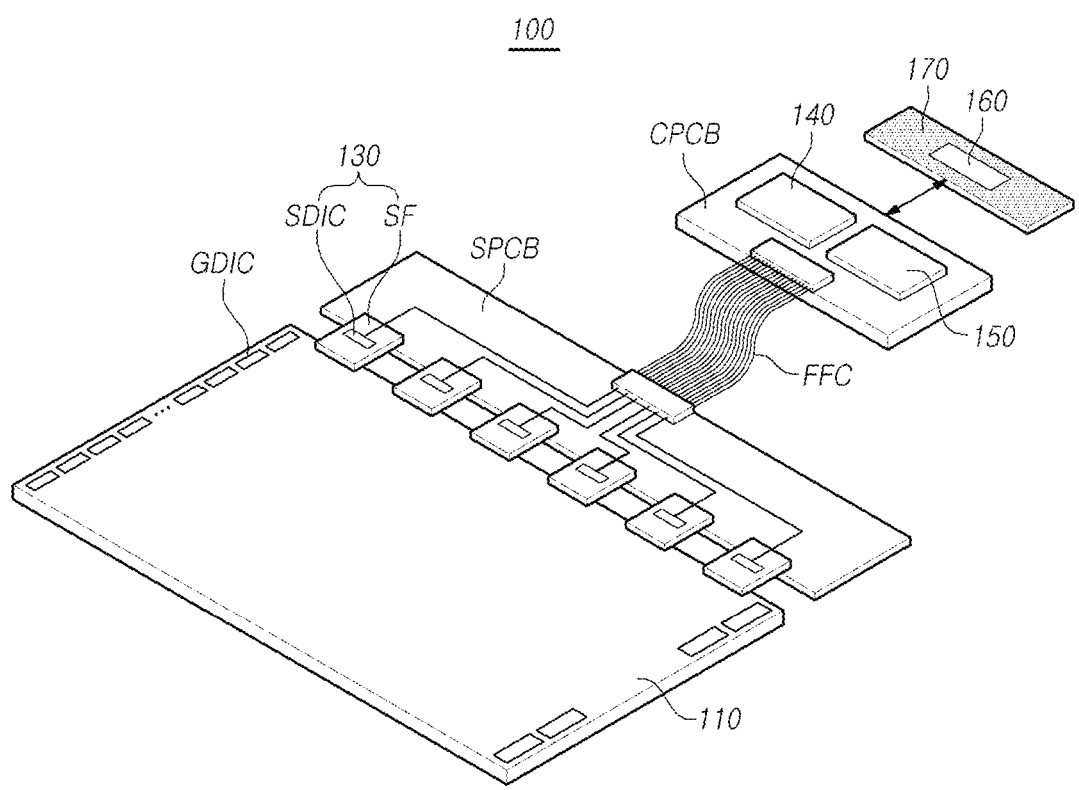
FIG. 2 is an example diagram illustrating a system of the display device according to embodiments.

The data driving circuit 130 may include one or more source driving integrated circuits SDIC (see FIG. 2). Each of the source driving integrated circuits SDIC may include a shift register, a latch circuit, a digital-to-analog converter (DAC), an output buffer, and the like. Each of the source driving integrated circuits SDIC may further include an analog-to-digital converter (ADC).

For example, each of the source driving integrated circuits SDIC may be connected to the display panel 110 using a tape-automated bonding (TAB) structure, may be connected to a bonding pad of the display panel 110 using a chip-on-glass (COG) structure or a chip-on-panel (COP) structure, or may be implemented using a chip-on-film (COF) structure connected to the display panel 110.

The gate driving circuit 120 may output a gate signal having a turn-on-level voltage or a gate signal having a turn-off-level voltage under the control of the timing controller 140. The gate driving circuit 120 may sequentially drive the plurality of gate lines GL by sequentially supplying the gate signal having a turn-on-level voltage to the plurality of gate lines GL.

The gate driving circuit 120 may include one or more gate driving integrated circuits GDIC (see FIG. 2).

The gate driving circuit 120 may be connected to the display panel 110 using a TAB structure, connected to bonding pads of the display panel 110 using a COG structure or a COP structure, or connected to the display panel 110 using a COF structure. Alternatively, the gate driving circuit 120 may be implemented using a gate-in-panel (GIP) structure provided in the bezel area BA of the display panel 110. The gate driving circuit 120 may be disposed on a circuit board or connected to the circuit board. That is, when the gate driving circuit 120 has a GIP structure, the gate driving circuit 120 may be disposed in the bezel area BA. When the gate driving circuit 120 has a COG structure, a COF structure, or the like, the gate driving circuit 120 may be connected to the circuit board.

In addition, at least one driving circuit of the data driving circuit 130 and the gate driving circuit 120 may be disposed in the display area DA. For example, at least one driving circuit of the data driving circuit 130 and the gate driving circuit 120 may be disposed to not overlap the subpixels SP or disposed such that a portion or the entirety thereof overlaps the subpixels SP.

The data driving circuit 130 may be connected to one side (e.g., the upper side or the lower side) of the display panel 110. The data driving circuit 130 may be connected to both sides (e.g., the upper side and the lower side) of the display panel 110 or two or more sides of four sides of the display panel 110, depending on the driving method, the design of the display panel, or the like.

The gate driving circuit 120 may be connected to one side (e.g., the left side or the right side) of the display panel 110. The gate driving circuit 120 may be connected to both sides (e.g., the left side and the right side) of the display panel 110 or two or more sides of four sides of the display panel 110, depending on the driving method, the design of the display panel, or the like.

The timing controller 140 may be provided as a component separate from the data driving circuit 130 or may be combined with the data driving circuit 130 to form an integrated circuit (IC). The timing controller 140 may be a timing controller used in typical display technology, may be a control device including a timing controller and performing other control functions, or may be a circuit in the control device. The timing controller 140 may be implemented as any of a variety of circuits or electronic components such as an IC, a field programmable gate array (FPGA), an application specific integrated circuit (ASIC), or a processor.

The timing controller 140 may be mounted on a printed circuit board (PCB), a flexible printed circuit (FPC), or the like, and may be electrically connected to the data driving circuit 130 and the gate driving circuit 120 through the PCB, the FPC, or the like. The timing controller 140 may transmit and receive signals to and from the data driving circuit 130 according to predetermined one or more interfaces. Here, for example, the interfaces may include a low voltage differential signaling (LVDS) interface, an embedded panel interface (EPI), a serial peripheral (SP) interface, and the like.

The display device 100 according to embodiments may be a self-light-emitting display device in which the display panel 110 emits light by itself. When the display device 100 according to embodiments is a self-light-emitting display device, each of the plurality of subpixels SP may include a light-emitting element. In an example, the display device 100 according to embodiments may be an organic light-emitting display device in which light-emitting elements are organic light-emitting diodes (OLEDs). In another example, the display device 100 according to embodiments may be an inorganic light-emitting display device in which light-emitting elements are light-emitting diodes (LEDs) based on an inorganic material. In another example, the display device 100 according to embodiments may be a quantum dot display device in which light-emitting elements are quantum dots serving as self-light-emitting semiconductor crystals.

FIG. 2 is an example diagram illustrating a system of the display device according to embodiments.

Referring to FIG. 2, the display device 100 according to embodiments is an example in which the data driving circuit 130 is implemented using a COF structure from among a variety of structures such as TAB, COG, and COF structures, and the gate driving circuit 120 is implemented using a GIP structure from among a variety of structures such as TAB, COG, COF, and GIP structures.

When the gate driving circuit 120 has the GIP structure, the plurality of gate driving integrated circuits GDIC of the gate driving circuit 120 may be directly formed in the bezel area of the display panel 110. Here, the gate driving integrated circuits GDIC may be provided with a variety of signals (e.g., a clock, a gate high signal, and a gate low signal) required for generation of scan signals through gate driving-related signal lines disposed in the bezel area.

In the same manner, the source driving integrated circuits SDIC of the data driving circuit 130 may be mounted on source films SF, respectively. One side of each of the source films SF may be electrically connected to the display panel 110. In addition, conductive lines electrically connecting the source driving integrated circuits SDIC to the display panel 110 may be disposed on the top portions of the source films SF.

The display device 100 may include at least one source printed circuit board SPCB and a control printed circuit board CPCB for circuit connection of the plurality of source driving integrated circuits SDIC to other devices. Here, control components and a variety of electrical devices may be mounted on the control printed circuit board CPCB.

Here, the other sides of the source films SF on which the source driving integrated circuits SDIC are mounted may be connected to the source printed circuit board SPCB. That is, each of the source films SF on which the source driving integrated circuits SDIC are mounted may be configured such that one side thereof is electrically connected to the display panel 110 and the other side thereof is electrically connected to the source printed circuit board SPCB.

The timing controller 140 and a power management circuit 150 may be mounted on the control printed circuit board CPCB. The timing controller 140 may control the operation of the data driving circuit 130 and the gate driving circuit 120. The power management circuit 150 may supply a driving voltage or current to the display panel 110, the data driving circuit 130, the gate driving circuit 120, and the like and may control the supplied voltage or current.

The source printed circuit board SPCB and the control printed circuit board CPCB may be circuit-connected to each other through at least one connecting member. The connecting member may be, for example, a flexible flat cable FFC, a flexible printed circuit (FPC), or the like. In addition, the source printed circuit board SPCB and the control printed circuit board CPCB may be integrated into a single printed circuit board (PCB).

The display device 100 may further include a set board 170 electrically connected to the control printed circuit board CPCB. Here, the set board 170 may also be referred to as a power board. The set board 170 may be provided with a main power management circuit 160 to manage the overall power of the display device 100. The main power management circuit 160 may work in concert with the power management circuit 150.

In the display device 100 having the above-described configuration, a driving voltage is generated by the set board 170 and is transferred to the power management circuit 150 in the control printed circuit board CPCB. The power management circuit 150 transfers the driving voltage, required for display driving or characteristic value sensing, to the source printed circuit board SPCB through the flexible printed circuit or the flexible flat cable FFC. The driving voltage transferred to the source printed circuit board SPCB is supplied through the source driving integrated circuits SDIC in order to light or sense a specific subpixel SP in the display panel 110.

Here, each of the subpixels SP arrayed in the display panel 110 of the display device 100 may include a light-emitting element and circuit elements, such as a driving transistor, for driving the light-emitting element.

The type and number of the circuit elements provided in each of the subpixels SP may be determined variously depending on functions to be provided, designs, and the like.

Figure 3:
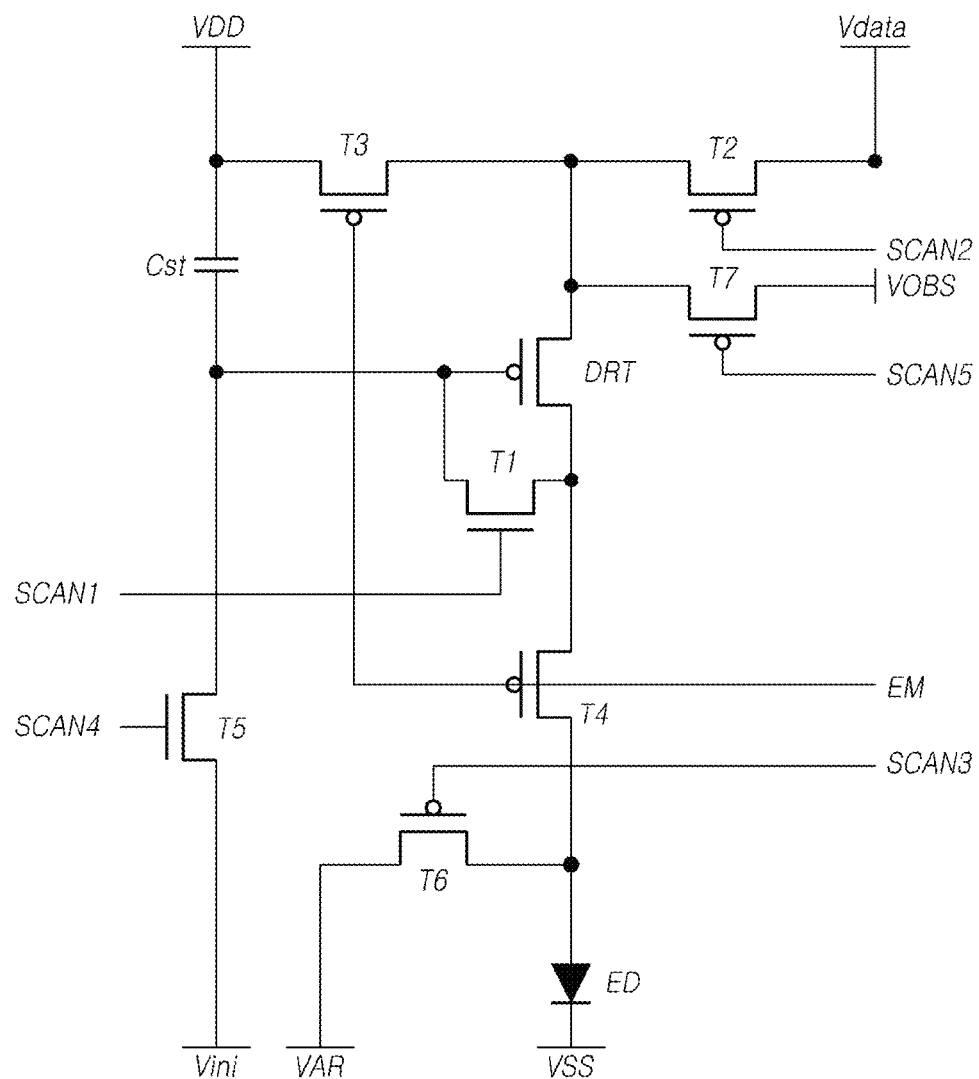
FIG. 3 is a diagram illustrating a subpixel circuit in the display device according to embodiments.

FIG. 3 is a diagram illustrating a subpixel circuit in the display device according to embodiments.

Referring to FIG. 3, a subpixel SP in the display device 100 according to embodiments may include first to seventh switching transistors T1 to T7, a driving transistor DRT, a storage capacitor Cst, and a light-emitting element ED.

Here, the light-emitting element ED may be, for example, self-light-emitting element, such as an organic light emitting diode (OLED), able to emit light by itself.

In the subpixel SP according to some embodiments, the second to fourth switching transistors T2 to T4, the sixth switching transistor T6, the seventh switching transistor T7, and the driving transistor DRT may be P-type transistors, while the first switching transistor T1 and the fifth switching transistor T5 may be N-type transistors.

P-type transistors are more reliable than N-type transistors. P-type transistors have an advantage in that current flowing through the light-emitting element ED is not fluctuated by the capacitor Cst, since the source electrode may be fixed to a high-potential driving voltage VDD during lighting. Thus, it is easy to reliably supply current.

When a P-type transistor is connected to the anode of the light-emitting element ED and operates in a saturation region, a predetermined amount of current may be flowed irrespective of changes in the threshold voltage. Thus, reliability is relatively high.

In this structure of the subpixel SP, each of the N-type transistors T1 and T5 may be formed of an oxide transistor (e.g., a transistor having a channel formed from an oxide semiconductor such as an In, Ga, or Zn oxide or an indium gallium zinc oxide (IGZO)) formed using a semiconducting oxide, while each of the P-type transistors DRT, T2 to T4, T6, and T7 may be a silicon (Si) transistor (e.g., a transistor referred to as a low-temperature polycrystalline silicon (LTPS) transistor having a poly-Si channel formed using a low-temperature process) formed from a transistor material such as Si.

The oxide transistor is characterized by a lower leakage current than the silicon transistor. Thus, when a transistor is formed of an oxide transistor, a leakage current from the gate electrode of the driving transistor DRT may be prevented, thereby reducing defects in image quality such as flicker.

In addition, each of the P-type transistors DRT, T2 to T4, T6, and T7, except for the N-type transistors such as the first switching transistor T1 and the fifth switching transistor T5, may be formed of an LTPS transistor.

The source electrode and the drain electrode of each of the switching transistors may be referred to as a drain electrode and a source electrode depending on the input voltage.

The gate electrode of the first switching transistor T1 is provided with a first scan signal SCAN1. The drain electrode of the first switching transistor T1 is connected to the gate electrode of the driving transistor DRT. In addition, the source electrode of the first switching transistor T1 is connected to the drain electrode of the driving transistor DRT.

The first switching transistor T1 is turned on by the first scan signal SCAN1 to maintain the gate voltage of the driving transistor DRT constant using the storage capacitor Cst, one terminal of which is fixed to the high-potential driving voltage VDD.

The first switching transistor T1 may be formed of an N-type MOS transistor to form an oxide transistor. Since N-type MOS transistors use electrons as carriers instead of holes, N-type MOS transistors may have higher mobility and thus higher switching speeds than P-type MOS transistors.

The gate electrode of the second switching transistor T2 is provided with a second scan signal SCAN2. The source electrode of the second switching transistor T2 may be provided with a data voltage Vdata. The drain electrode of the second switching transistor T2 is connected to the source electrode of the driving transistor DRT.

The second switching transistor T2 is turned on by the second scan signal SCAN2 to supply the data voltage Vdata to the source electrode of the driving transistor DRT.

The gate electrode of the third switching transistor T3 is provided with an emission signal EM. The source electrode of the third switching transistor T3 is provided with the high-potential driving voltage VDD. The drain electrode of the third switching transistor T3 is connected to the source electrode of the driving transistor DRT.

The third switching transistor T3 is turned on by the emission signal EM to supply the high-potential driving voltage VDD to the source electrode of the driving transistor DRT.

The gate electrode of the fourth switching transistor T4 is provided with the emission signal EM. The source electrode of the fourth switching transistor T4 is connected to the drain electrode of the driving transistor DRT. The drain electrode of the fourth switching transistor T4 is connected to the anode of the light-emitting element ED.

The fourth switching transistor T4 is turned on by the emission signal EM to supply a driving current to the anode of the light-emitting element ED.

The gate electrode of the fifth switching transistor T5 is provided with a fourth scan signal SCAN4.

Here, the fourth scan signal SCAN4 may be a signal having a different phase from the first scan signal SCAN1 supplied to a subpixel SP in another position. For example, when the first scan signal SCAN1 is applied to the nth gate line, the fourth scan signal SCAN4 may be a first scan signal SCAN1[n−1] applied to the (n−1)th gate line. That is, the fourth scan signal SCAN4 may use the first scan signal SCAN1, the gate line GL of which differs depending on the phase at which the display panel 110 is driven.

The drain electrode of the fifth switching transistor T5 is provided with a stabilization voltage Vini. The source electrode of the fifth switching transistor T5 is connected to the gate electrode of the driving transistor DRT and the storage capacitor Cst.

The fifth switching transistor T5 is turned on by the fourth scan signal SCAN4 to supply a stabilization voltage Vini to the gate electrode of the driving transistor DRT.

The gate electrode of the sixth switching transistor T6 is provided with a third scan signal SCAN3.

The source electrode of the sixth switching transistor T6 is provided with a reset voltage VAR. The drain electrode of the sixth switching transistor T6 is connected to the anode of the light-emitting element ED.

The sixth switching transistor T6 is turned on by the third scan signal SCAN3 to supply the reset voltage VAR to the anode of the light-emitting element ED.

The gate electrode of the seventh switching transistor T7 is provided with a fifth scan signal SCAN5.

The source electrode of the seventh switching transistor T7 is provided with a bias voltage VOBS. The drain electrode of the seventh switching transistor T7 is connected to the source electrode of the driving transistor DRT.

Here, the fifth scan signal SCAN5 may be a signal having a different phase from the third scan signal SCAN3 supplied to a subpixel SP in another position. For example, when the third scan signal SCAN3 is applied to the nth gate line, the fifth scan signal SCAN5 may be a third scan signal SCAN3 applied to the (n−1)th gate line. That is, the fifth scan signal SCAN5 may use the third scan signal SCAN3, the gate line GL of which differs depending on the phase at which the display panel 110 is driven.

In addition, since the fifth scan signal SCAN5 is a signal for applying the bias voltage VOBS to the driving transistor DRT, the fifth scan signal SCAN5 may be distinguished from the second scan signal SCAN2 for applying the data voltage Vdata.

The gate electrode of the driving transistor DRT is connected to the drain electrode of the first switching transistor T1. The source electrode of the driving transistor DRT is connected to the drain electrode of the second switching transistor T2. The drain electrode of the driving transistor DRT is connected to the source electrode of the first switching transistor T1.

The driving transistor DRT is turned on due to the difference in voltage between the source electrode and the drain electrode, and thus the driving current is applied to the light-emitting element ED.

The source electrode and the drain electrode of the first switching transistor T1 are connected to the drain electrode and the gate electrode of the driving transistor DRT, respectively. The operation of sampling and compensating for the threshold voltage of the driving transistor DRT may be activated by the data voltage Vdata applied to the source electrode of the driving transistor DRT in a state in which the first switching transistor T1 is turned on.

One electrode of the storage capacitor Cst is provided with the high-potential driving voltage VDD, and the other electrode of the storage capacitor Cst is connected to the gate electrode of the driving transistor DRT. The storage capacitor Cst stores the voltage of the gate electrode of the driving transistor DRT.

The anode of the light-emitting element ED is connected to the drain electrode of the fourth switching transistor T4 and the drain electrode of the sixth switching transistor T6. A low-potential driving voltage VSS is applied to the cathode of the light-emitting element ED.

The light-emitting element ED generates light having a predetermined luminous intensity using the driving current flowing therethrough due to the driving transistor DRT.

Here, the stabilization voltage Vini is supplied to stabilize changes in capacitance created in the gate electrode of the driving transistor DRT, while the reset voltage VAR is supplied to reset the anode of the light-emitting element ED.

When the reset voltage VAR is supplied to the anode of the light-emitting element ED in a state in which the fourth switching transistor T4 located between the anode of the light-emitting element ED and the driving transistor DRT to be controlled by the emission signal EM is turned off, the anode of the light-emitting element ED may be reset.

The sixth switching transistor T6 supplying the reset voltage VAR is connected to the anode of the light-emitting element ED.

The fourth scan signal SCAN4 for driving the driving transistor DRT or stabilizing the driving transistor DRT and the third scan signal SCAN3 for controlling the supply of the reset voltage VAR to the anode of the light-emitting element ED are separated so that the operation of driving the driving transistor DRT and the operation of resetting the anode of the light-emitting element ED may be performed separately.

In this case, the subpixel SP may be configured such that when the switching transistors T5 and T6 supplying the stabilization voltage Vini and the reset voltage VAR are turned on, the fourth switching transistor T4 connecting the drain electrode of the driving transistor DRT and the anode of the light-emitting element ED is turned off so as to block flow of the driving current of the driving transistor DRT to the anode of the light-emitting element ED and prevent other voltages from having an effect on the anode than the reset voltage VAR.

The subpixel SP including the eight transistors DRT, T1, T2, T3, T4, T5, T6, and T7 and the single capacitor Cst as described above may be referred to as having an 8T1C structure.

The 8T1C structure among a variety of circuit structures of the subpixel SP has been illustrated hereinabove, and the structure and number of the transistors and the capacitors of the subpixel SP may be changed variously. Respective subpixels among the plurality of subpixels SP may have the same structure or some subpixels among the plurality of subpixels SP may have a different structure.

Figure 4:
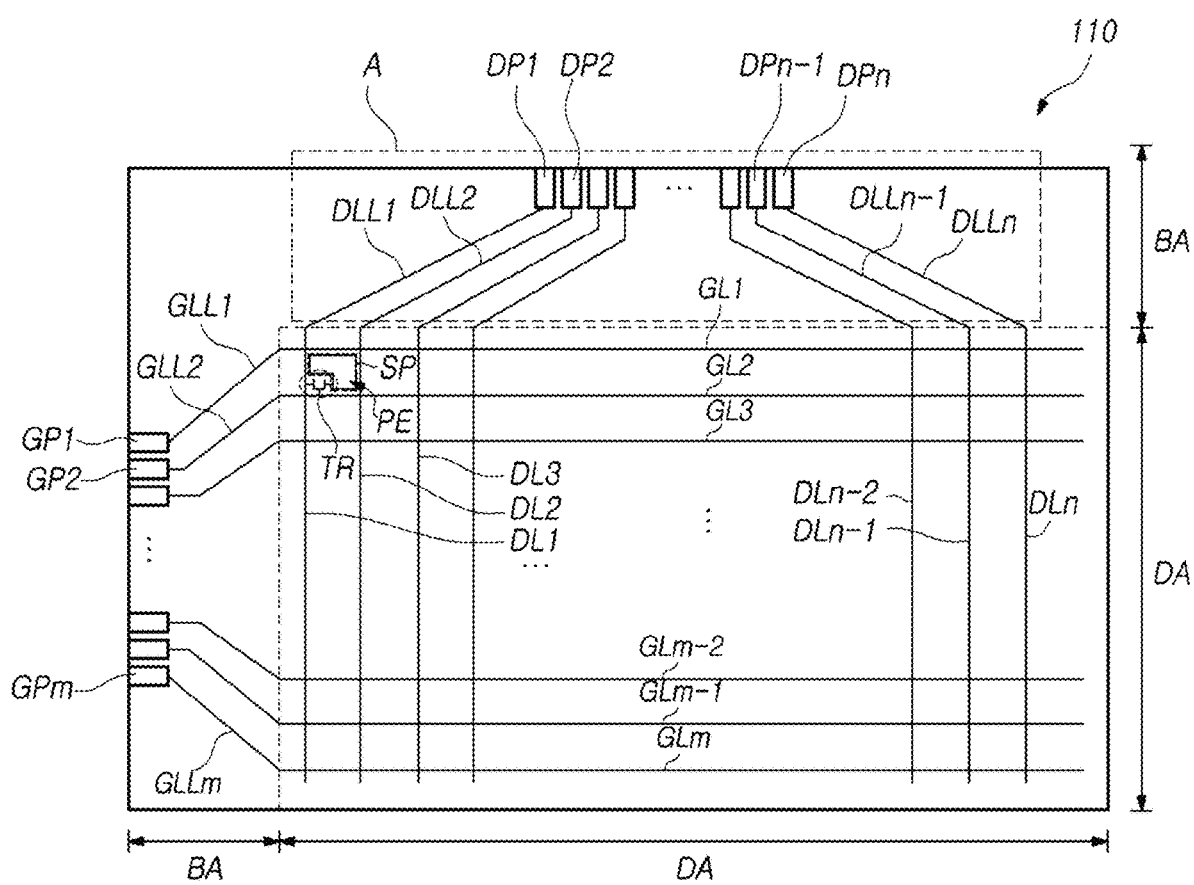
FIG. 4 is a plan diagram illustrating a display panel.

FIG. 4 is a plan diagram illustrating a display panel.

Referring to FIG. 4, the display panel 110 may be divided into a display area DA on which images are displayed and a bezel area BA outside the display area DA and on which no images are displayed.

In the display area DA, first to mth gate lines GL1 to GLm to which gate signals are applied in one direction and first to nth data lines DL1 to DLn to which data signals are applied may be arranged in the form of a matrix. The first to nth data lines DL1 to DLn intersect the first to mth gate lines GL1 to GLm to define a plurality of subpixels SP.

A plurality of transistors TR for driving the subpixels SP are provided at intersections of the first to mth gate lines GL1 to GLm and the first to nth data lines DL1 to DLn. Pixel electrodes PE in contact with the transistors are provided to correspond to the subpixels SP in a one-to-one relationship.

The first to mth gate lines GL1 to GLm and the first to nth data lines DL1 to DLn are connected to first to mth gate pads GP1 to GPm and first to nth data pads DP1 to DPn through first to mth gate link lines GLL1 to GLLm and first to nth data link lines DLL1 to DLLn formed in the bezel area BA.

Here, the first to mth gate pads GP1 to GPm are electrically connected to the gate driving circuit 120. An area in which the first to mth gate pads GP1 to GPm are formed corresponds to the area of the gate driving circuit 120.

In addition, the first to nth data pads DP1 to DPn are electrically connected to the data driving circuit 130. An area in which the first to nth data pads DP1 to DPn are formed corresponds to the area of the data driving circuit 130.

Figure 5:
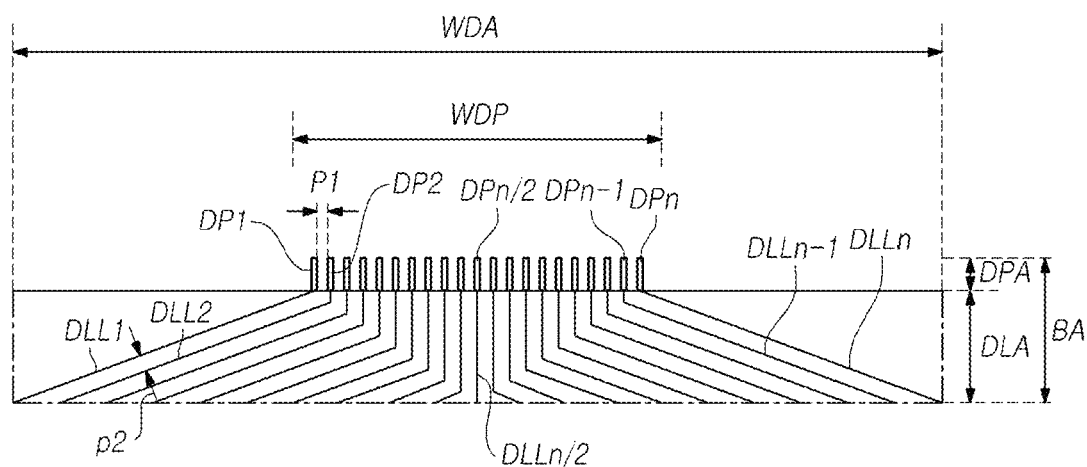
FIG. 5 is an enlarged diagram of the part A in FIG. 4.

FIG. 5 is an enlarged diagram of the part A in FIG. 4.

Referring to FIG. 5, the bezel area BA adjacent to the data driving circuit 130 may include a data link area DLA in which the data link lines DLL1 to DLLn are formed and a data pad part DPA in which the data pads DP1 to DPn are formed.

The first to nth data pads DP1 to DPn formed in the data pad part DPA are spaced apart from each other at predetermined pad pitches P1.

The first to nth data link lines DLL1 to DLLn corresponding to the first to nth data pads DP1 to DPn in a one-to-one relationship serve to apply data signals to the first to nth data lines DL1 to DLn.

The width WDP of a data pad part in which the first to nth data pads DP1 to DPn are arranged in the horizontal direction corresponds to the width of the data driving circuit 130. Since the width of the data driving circuit 130 is narrower than the width WDA of the display area, the width WDP of the data pad part is narrower than the width WDA of the display area.

Thus, in the display panel 110 of the related art, the first to nth data link lines DLL1 to DLLn have a slant structure. That is, the first to nth data link lines DLL1 to DLLn extend in the form of slants from the first to nth data pads DP1 to DPn toward the display panel 110.

Here, the first to nth data link lines DLL1 to DLLn may be designed with the same widths, the first to nth data link lines DLL1 to DLLn may be spaced apart from each other at uniform link pitches P2.

According to this slant structure, the lengths of the data link lines increase in the direction of from the (n/2−1)th data link line DLLn/2−1 to the first data link line DLL1 with respect to the n/2th data link line DLLn/2. The lengths of the data link lines also increase in the direction of from the (n/2+1)th data link line DLLn/2+1 to the nth data link line DLLn with respect to the n/2th data link line DLLn/2.

Here, the thickness of the data link area DLA may be determined in consideration of the difference between the width WDP of the data pad part and the width WDA of the display area and the link pitches P2 of the data link lines DLL1 to DLLn.

For example, the greater the difference between the width WDP of the data pad part and the width WDA of the display area, the closer the outermost data link lines DLL1 and DLLn are to the horizon. Thus, it is required to increase the distances between the data pads and the display area DA in consideration of the link pitches P2 of the data link lines DLL1 to DLLn.

In particular, the greater the size or the higher the resolution of the display device 100, the greater the number of the data lines DL and the number of data link lines DLL are. As a result, the width of the data link area DLA is increased, thereby increasing the size of the bezel area BA.

The display device 100 according to the present disclosure may implement a narrow bezel and improve image quality by forming the same length of horizontal data link lines DLL disposed in the display area DA of the display panel 110.

Figure 6:
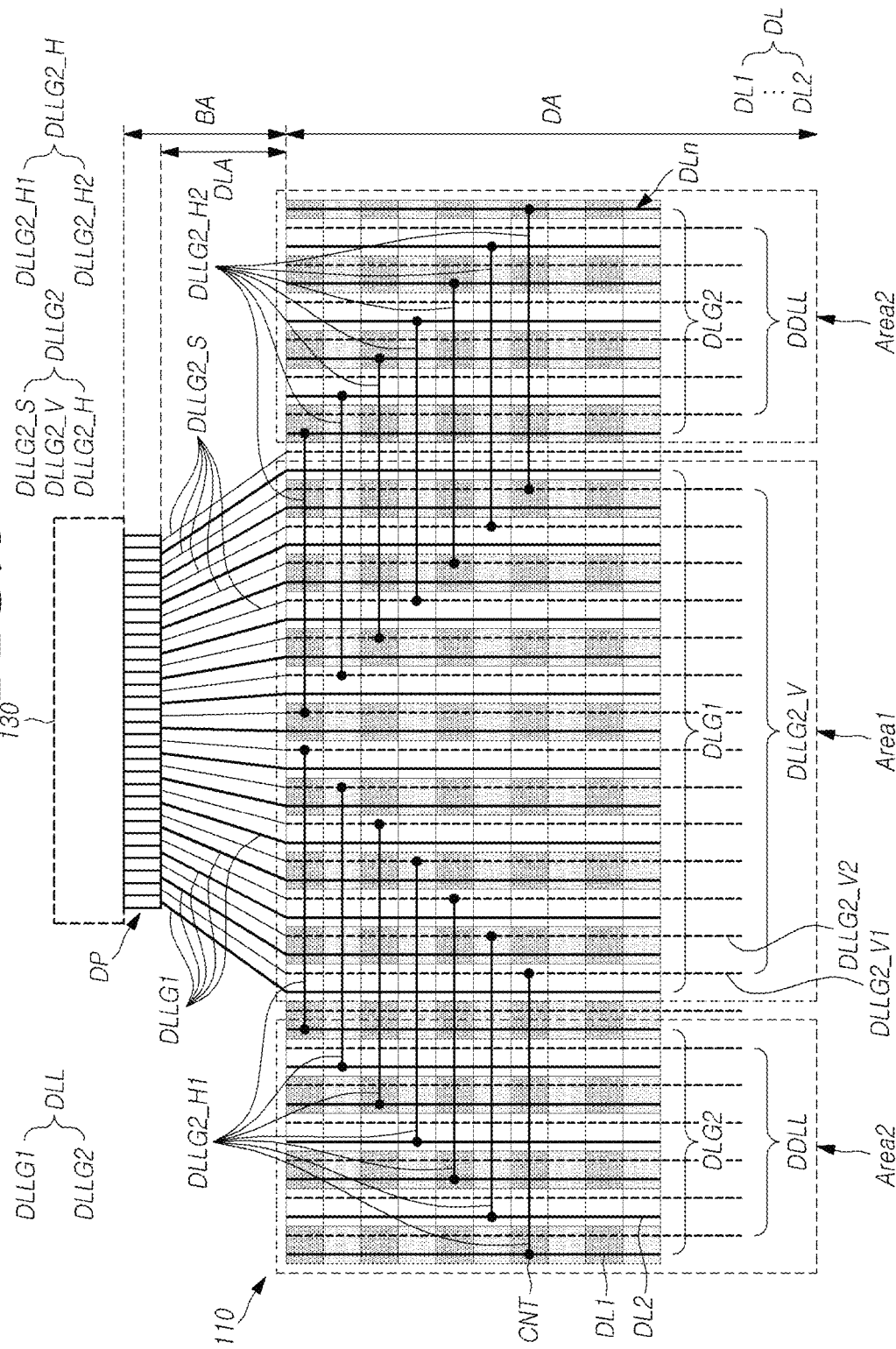
FIG. 6 is a plan diagram illustrating a structure of the display panel according to embodiments.

FIG. 6 is a plan diagram illustrating a structure of the display panel according to embodiments.

Referring to FIG. 6, the display panel 110 according to the present disclosure may be divided into a display area DA on which images are displayed and a bezel area BA outside the display area DA and on which no images are displayed.

In FIG. 6, only a data pad part DP connected to the data driving circuit 130 and data link lines DLL extending from the data pad part DP in the direction of the display panel 110 are depicted in the bezel area BA.

A plurality of data lines DL extending in a first direction (e.g., a column direction) to receive data signals output from the data driving circuit 130 may be disposed in the display area DA. A plurality of gate lines (GL in FIG. 4) extending in a second direction (e.g., a row direction) to receive gate signals output from the gate driving circuit 120 may be disposed in the display area DA. A plurality of subpixels (SP in FIG. 4) may be formed in areas in which the gate lines (GL in FIG. 4) intersect the data lines DL.

Here, for the convenience of description, the gate lines (GL in FIG. 4) are omitted, and only the data link lines DLL and data lines DL are depicted.

The plurality of data lines DL may extend in parallel in the first direction (e.g., a column direction) of the display panel 110 from the data driving circuit 130.

The plurality of data lines DL may include a first data line group DLG1 disposed in a first area Area1 corresponding to the data driving circuit 130 and a second data line group DLG2 disposed in second areas Area2 located on outside of the first area Area1.

In the display device 100 according to the present disclosure, the first data line group DLG1 disposed in the first area Area1 corresponding to the data driving circuit 130 is connected to a first data link line group DLLG1 having a linear structure and the second data line group DLG2 disposed in the second areas Area2 located on outside of the first area Area1 is connected to a second data link line group DLLG2 having a bending structure in order to form the area in which the data driving circuit 130 is located into a narrow bezel.

The first area Area1 corresponding to the data driving circuit 130 is an area of the display area DA of the display panel 110 corresponding to the width of the data driving circuit 130. Since the first area Area1 corresponds to the data driving circuit 130 in the first direction (e.g., a column direction), the first data line group DLG1 disposed in the first area Area1 may be connected to the data driving circuit 130 using the first data link line group DLLG1 having a linear structure.

The first data link line group DLLG1 extends from the data driving circuit 130 and is connected to the first data line group DLG1 of the first area Area1 corresponding to the data driving circuit 130. Thus, the first data link line group DLLG1 may be located in the data link area DLA.

The second areas Area2 located on outside of the first area Area1 correspond to portions of the display area DA disposed on both sides of the first area Area1. The display device 100 according to the present disclosure includes the second data link line group DLLG2 having a bending structure and connecting the second data line group DLG2 disposed in the second areas Area2 to the data driving circuit 130.

The second data line group DLLG2 may include straight (2-1)th data link lines DLLG2_S, vertical (2-2)th data link lines DLLG2_V, and horizontal (2-3)th data link lines DLLG2_H to connect the second data line group DLG2 of the second areas Area2 located on outside of the first area Area1.

The straight (2-1)th data link lines DLLG2_S extend from the data pad part DP connected to the data driving circuit 130 to the first area Area1 corresponding to the data driving circuit 130.

The vertical (2-2)th data link lines DLLG2_V are disposed in the first direction (e.g., a column direction) to be in parallel to the first data line group DLG1 of the first area Area1 corresponding to the data driving circuit 130. The vertical (2-2)th data link lines DLLG2_V are formed in the display area DA. Here, the vertical (2-2)th data link lines DLLG2_V may be disposed to alternate with data lines of the first data line group DLG1.

The straight (2-1)th data link lines DLLG2_S extend in the first direction (e.g., a column direction) and are connected to the vertical (2-2)th data link lines DLLG2_V in the first area Area1 corresponding to the data driving circuit 130.

The horizontal (2-3)th data link lines DLLG2_H extend in the second direction (e.g., a row direction) and are connected to the second data line group DLG2 of the second areas Area2 located on outside of the first area Area1. The horizontal (2-3)th data link lines DLLG2_H may be formed in the display area DA.

The second data line group DLG2 of the second areas Area2 located on outside of the first area Area1 may be connected to the vertical (2-2)th data link lines DLLG2_V disposed in parallel to the first data line group DLG1, connected to the straight (2-1)th data link lines DLLG2_S extending from the data pad part DP, and connected to the data driving circuit 130 through the horizontal (2-3)th data link lines DLLG2_H extending in the second direction (e.g., a row direction).

In the display device 100 of the present disclosure, the horizontal (2-3)th data link line DLLG2_H may have the same length in order to reduce parasitic capacitance formed between the horizontal (2-3)th data link line DLLG2_H and another signal line.

For example, the leftmost outer data line DL1 among the second data line group DLG2 disposed in the second area Area2 is connected to the leftmost (2-2)th data link line DLLG2_V1 among the vertical (2-2)th data link lines DLLG2_V disposed in the first area Area1.

In addition, the second data line DL2 disposed from the left side among the second data line group DLG2 disposed in the second area Area2 is connected to the second (2-2)th data link line DLLG2_V2 disposed from the left side among the vertical (2-2)th data link lines DLLG2_V located in the first area Area1.

As described above, when the horizontal (2-3)th data link lines DLLG2_H connecting the second data line group DLG2 disposed in the second area Area2 and the vertical (2-2)th data link lines DLLG2_V located in the first area Area1 have the same length, parasitic capacitance formed between the horizontal (2-3)th data link lines DLLG2_H and other signal lines may be reduced.

Here, it illustrates a structure as an example in which the horizontal (2-3)th data link lines DLLG2_H are disposed outside portions of the display panel 110 as they move away from the data driving circuit 130.

In addition, the structure in which the horizontal (2-3)th data link lines DLLG2_H are formed to have the same length may be applied to not only the left second area Area2 of the display panel 110 but also the right second area Area2 of the display panel 110.

At this time, it is preferable that the structure of the horizontal (2-3)th data link lines DLLG2_H1 arranged in the left second area Area2 of the display panel 110 is symmetrical with the structure of the horizontal (2-3)th data link lines DLLG2_H2 arranged in the right second area Area2 of the display panel 110 with respect to the center of the display panel 110.

The horizontal (2-3)th data link lines DLLG2_H may be connected to the vertical (2-2)th data link lines DLLG2_V and the second data line group DLG2 through contact holes. In addition, the horizontal (2-3)th data link lines DLLG2_H may be formed on a different layer from the vertical (2-2)th data link lines DLLG2_V and the second data line group DLG2.

In addition, in consideration of capacitance due to the vertical (2-2)th data link lines DLLG2_V disposed in the first area Area1 corresponding to the data driving circuit 130, dummy data link lines DDLL may be further disposed to alternate with data lines of the second data line group DLG2 of the second areas Area2 located on outside of the first area Area1.

As described above, when the second data line group DLG2 of the second areas Area2 located on outside of the first area Area1 is connected using the straight (2-1)th data link lines DLLG2_S extending from the data pad part DP, the vertical (2-2)th data link lines DLLG2_V disposed in parallel to the first data line group DLG1, and the horizontal (2-3)th data link lines DLLG2_H extending to the horizontal direction, link pitches between the data link lines may be obtained even in the case in which the distances between the data pads and the display area DA are reduced.

Thus, the width of the data link area DLA may be reduced, thereby realizing a narrow bezel.

Figure 7:
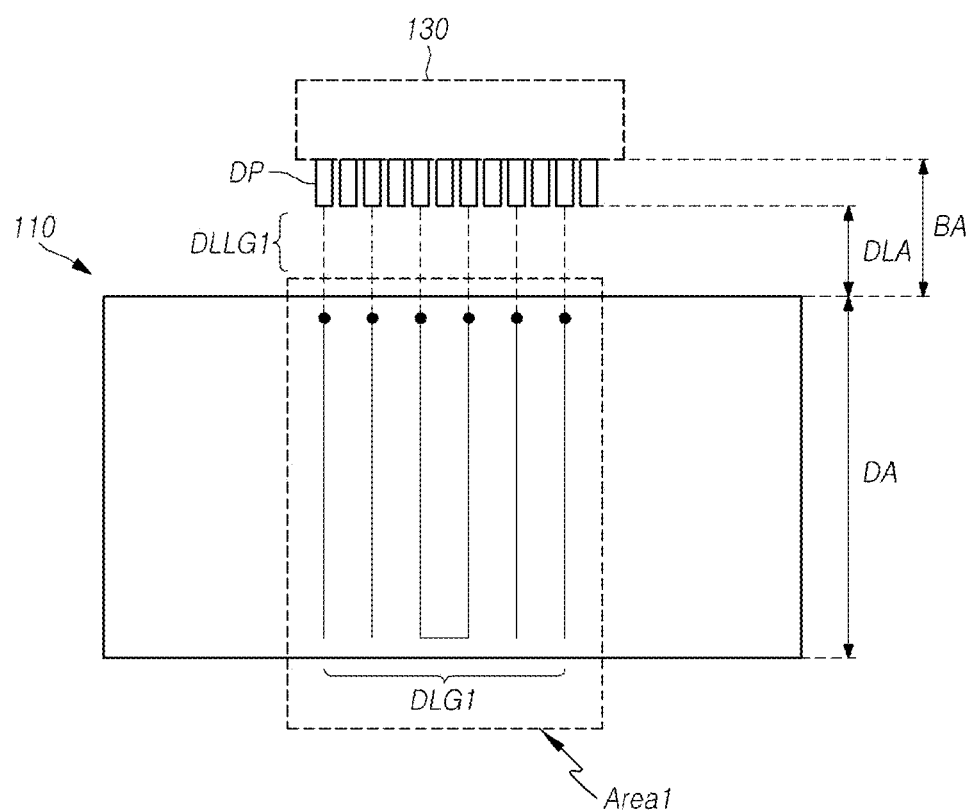
FIG. 7 is a diagram separately illustrating a connecting structure of data lines disposed in the first area corresponding to the data driving circuit in the display device according to embodiments.
Figure 8:
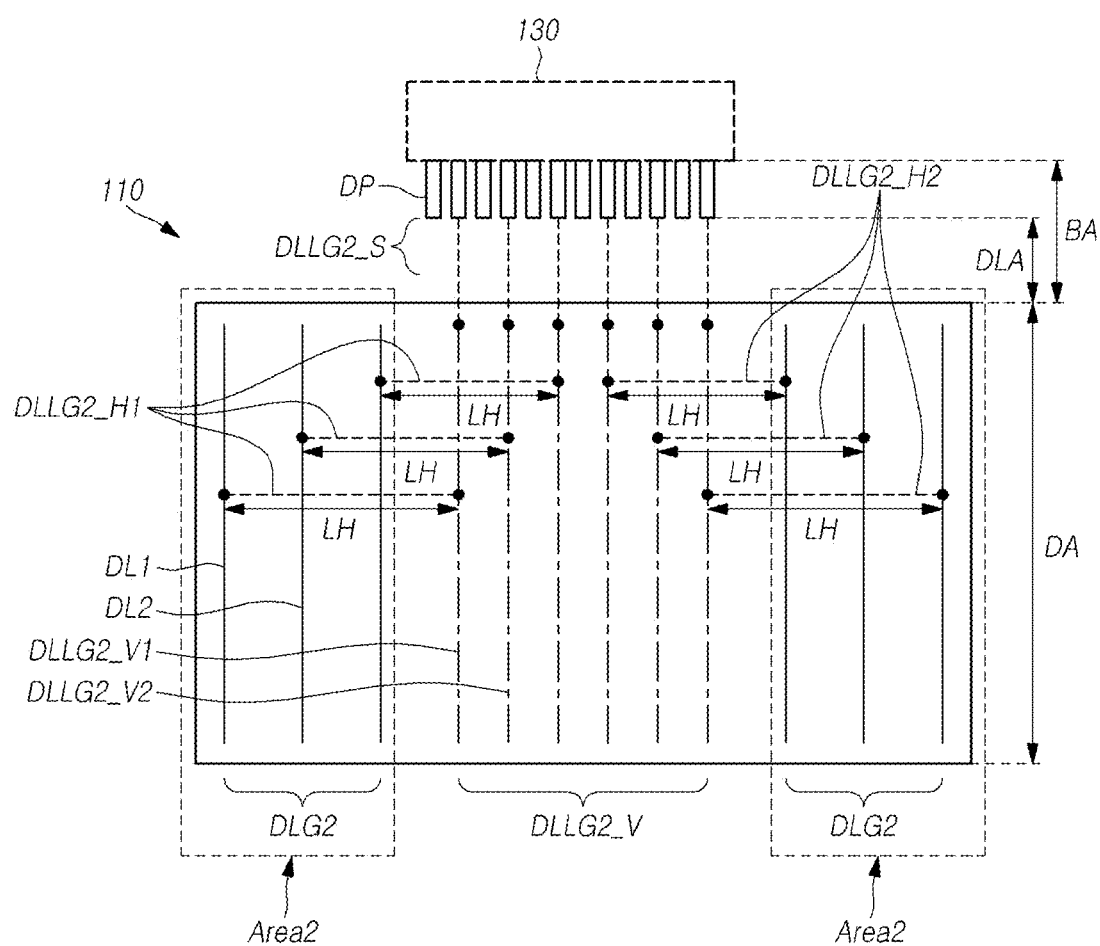
FIG. 8 is a diagram separately illustrating a connecting structure of data lines disposed in the second areas located on outside of the first area in the display device according to embodiments.

FIG. 7 is a diagram separately illustrating a connecting structure of data lines disposed in the first area corresponding to the data driving circuit in the display device according to embodiments, and FIG. 8 is a diagram separately illustrating a connecting structure of data lines disposed in the second areas corresponding to the locations outside the data driving circuit in the display device according to embodiments.

In FIGS. 7 and 8, the first area Area1 corresponding to the data driving circuit 130 and the second areas Area2 located on outside of the first area Area1 are separately illustrated for the convenience of description.

First, referring to FIG. 7, in the display device 100 according to embodiments, the first area Area1 corresponding to the data driving circuit 130 is a portion of the display area DA of the display panel 110 corresponding to the width of the data driving circuit 130. Since the first area Area1 is an area corresponding to the data driving circuit 130 in the first direction (e.g., a column direction), the first data line group DLG1 disposed in the first area Area1 may be connected to the data pad part DP through the first data link line group DLLG1 having a linear structure.

The first data link line group DLLG1 extends from the data pad part DP, and is directly connected to the first data line group DLG1 disposed in the first area Area1 corresponding to the data driving circuit 130. Thus, the first data link line group DLLG1 may be disposed in the data link area DLA.

Referring to FIG. 8, in the display device 100 according to embodiments, the second areas Area2 located on outside of the first area Area1 correspond to portions of the display area DA of the display panel 110 disposed on both sides of the first area Area1.

The second data line group DLG2 disposed in the second areas Area2 is connected to the data pad part DP through the second data link line group DLLG2 having a bending structure.

The second data link line group DLLG2 may include the straight (2-1)th data link lines DLLG2_S, the vertical (2-2)th data link lines DLLG2_V, and the horizontal (2-3)th data link lines DLLG2_H.

The straight (2-1)th data link lines DLLG2_S extend from the data pad part DP to the first area Area1 corresponding to the data driving circuit 130.

The vertical (2-2)th data link lines DLLG2_V are disposed in parallel to the first data line group DLG1 in the first area Area1.

The straight (2-1)th data link lines DLLG2_S are connected to the vertical (2-2)th data link lines DLLG2_V in the first area Area1.

The horizontal (2-3)th data link lines DLLG2_H extend in the second direction (e.g., a row direction) and are connected to the second data line group DLG2 of the second areas Area2.

In the display device 100 of the present disclosure, the horizontal (2-3)th data link lines DLLG2_H may have the same length in order to reduce parasitic capacitance formed between the horizontal (2-3)th data link lines DLLG2_H and another signal line.

For example, the leftmost outer data line DL1 among the second data line group DLG2 disposed in the second area Area2 is connected to the leftmost (2-2)th data link line DLLG2_V1 among the vertical (2-2)th data link lines DLLG2_V disposed in the first area Area1.

In addition, the second data line DL2 disposed from the left side among the second data line group DLG2 disposed in the second area Area2 is connected to the second (2-2)th data link line DLLG2_V2 disposed from the left side among the vertical (2-2)th data link lines DLLG2_V located in the first area Area1.

As described above, when the horizontal (2-3)th data link lines DLLG2_H1 disposed in the left second area Area2 of the display panel 110 have the same length, parasitic capacitance formed between the horizontal (2-3)th data link lines DLLG2_H1 and other signal lines may be reduced.

Likewise, when the horizontal (2-3)th data link lines DLLG2_H2 disposed in the right second area Area2 of the display panel 110 have the same length, parasitic capacitance formed between the horizontal (2-3)th data link lines DLLG2_H2 and other signal lines may be reduced.

At this time, it is preferable that the structure of the horizontal (2-3)th data link lines DLLG2_H1 arranged in the left second area Area2 of the display panel 110 is symmetrical with the structure of the horizontal (2-3)th data link lines DLLG2_H2 arranged in the right second area Area2 of the display panel 110 with respect to the center of the display panel 110.

Figure 9:
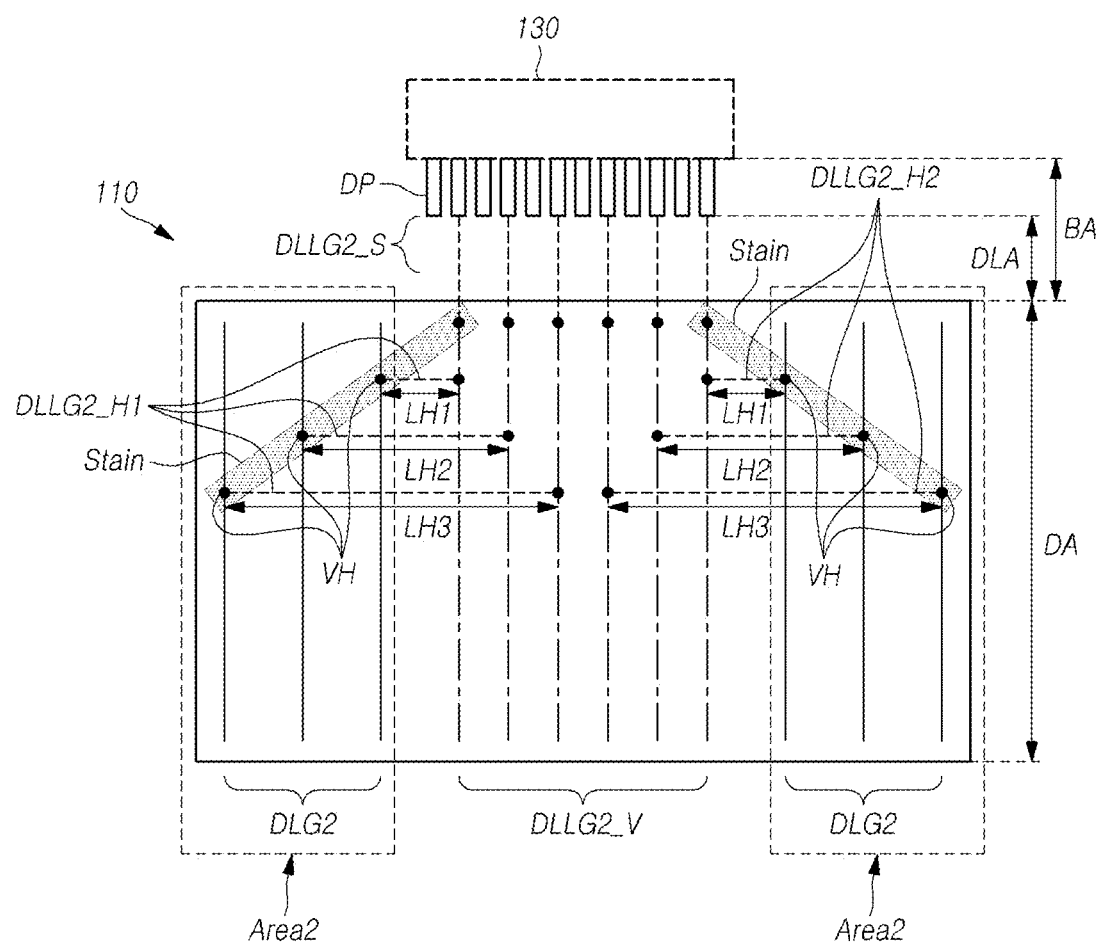
FIG. 9 is a diagram illustrating a case in which a stain is formed in an area due to the horizontal (2-3)th data link lines with different length in the display device according to embodiments.

FIG. 9 is a diagram illustrating a case in which a stain is formed in an area due to the horizontal (2-3)th data link lines with different length in the display device according to embodiments.

Referring to FIG. 9, in the display device 100 according to embodiments, the first data line group DLG1 disposed in the first area Area1 corresponding to the data driving circuit 130 may be connected using the first data link line group DLLG1 having a linear structure, and the second data line group DLG2 disposed in the second areas Area2 located on outside of the first area Area1 may be connected using the second data link line group DLLG2 having a bending structure.

Here, the second data link line group DLLG2 may include the straight (2-1)th data link lines DLLG2_S, the vertical (2-2)th data link lines DLLG2_V, and the horizontal (2-3)th data link lines DLLG2_H in order to connect the second data line group DLG2 of the second areas Area2 located on outside of the first area Area1.

At this time, when the lengths (LH1-LH3) of the horizontal (2-3)th data link lines DLLG2_H connecting between the vertical (2-2)th data link lines DLLG2_V disposed in the first area Area1 and a second data line group DLG2 disposed in the second area Area2 vary depending on positions, stains with different luminance may appear along the bending point VH at which the second data line group DLG2 is connected to the horizontal (2-3)th data link lines DLLG2_H.

Figure 10:
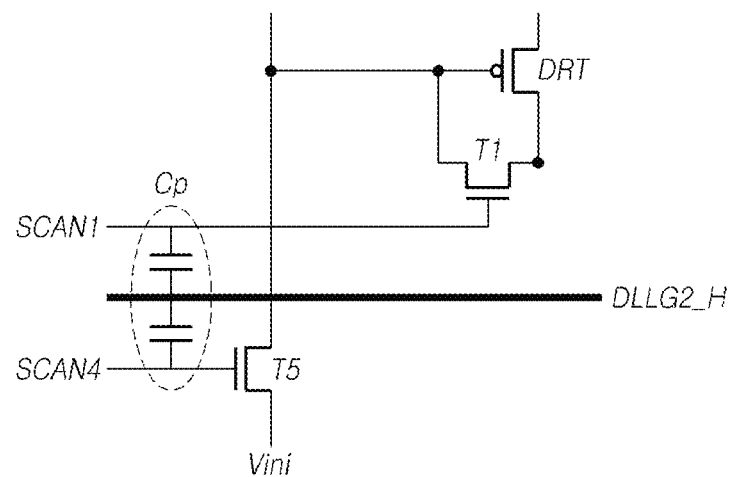
FIG. 10 is a circuit diagram illustrating a phenomenon in which a stain is formed due to the second data link line group having a bending structure in the display device according to embodiments.

FIG. 10 is a circuit diagram illustrating a phenomenon in which a stain is formed due to the second data link line structure in the display device group having a bending according to embodiments.

Referring to FIG. 10, in the display device 100 according to embodiments, a stain having a different luminance from other areas may appear along the bending points (VH in FIG. 9) at which the second data line group DLG2 is connected to the horizontal (2-3)th data link lines DLLG2_H. According to an experiment result, this phenomenon is mainly caused by parasitic capacitance Cp created between the horizontal (2-3)th data link lines DLLG2_H and gate lines which transmit scan signals SCAN.

In particular, it was confirmed that the first scan signal SCAN1 applied to the first switching transistor T1 in order to keep the gate voltage of the driving transistor DRT constant and the fourth scan signal SCAN4 controlling the fifth switching transistor T5 in order to apply stabilization voltage Vini to the gate electrode of the driving transistor DRT may form a large parasitic capacitance Cp in the horizontal (2-3)th data link lines DLLG2_H.

As a result, a luminance difference occurs along the bending points (VH in FIG. 9) where the second data line group DLG2 is connected to the horizontal (2-3)th data link lines DLLG2_H, and stains may appear.

Thus, when the horizontal (2-3)th data link lines DLLG2_H connecting between the second data line group DLG2 disposed in the second area Area2 and the vertical (2-2)th data link lines DLLG2_V located in the first area Area1 have the same length, parasitic capacitance formed between the horizontal (2-3)th data link lines DLLG2_H and other signal lines may be reduced and image quality may be improved.

Figure 11:
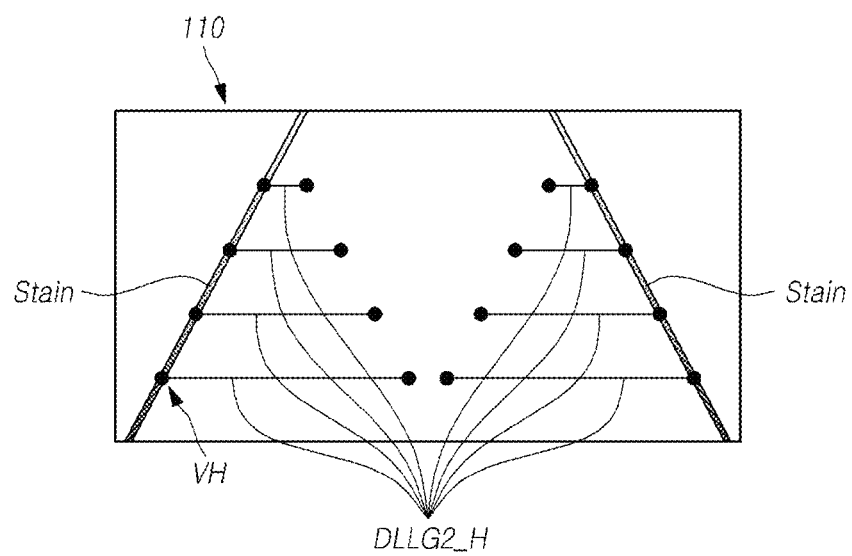
FIG. 11 is a diagram illustrating stains according to shapes of the horizontal (2-3)th data link lines in a display device according to embodiments of the present disclosure.
Figure 11:
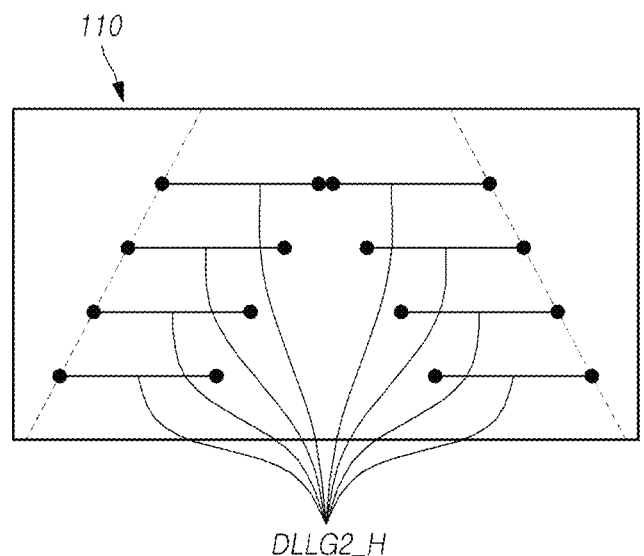

FIG. 11 is a diagram illustrating stains according to shapes of the horizontal (2-3)th data link lines in a display device according to embodiments of the present disclosure.

Referring to FIG. 11, when the length of the horizontal (2-3)th data link lines DLLG2_H connecting between the vertical (2-2)th data link lines DLLG2_V disposed in the first area Area1 and the second data line group DLG2 disposed at the second area Area2 in the display device 100 according to embodiments of the present disclosure vary according to positions, stains with different luminance may appear along the bending point VH at which the second data line group DLG2 is connected to the horizontal (2-3)th data link lines DLLG2_H (in the case of (a)).

On the other hand, when the horizontal (2-3)th data link lines DLLG2_H connecting between the second data line group DLG2 disposed in the second area Area2 and the vertical (2-2)th data link lines DLLG2_V located in the first area Area1 have the same length, parasitic capacitance formed between the horizontal (2-3)th data link lines DLLG2_H and other signal lines may be reduced. As a result, stains generated along the bending point VH at which the second data line group DLG2 is connected to the horizontal (2-3)th data link lines DLLG2_H may be reduced (in the case of (b)).

Figure 12:
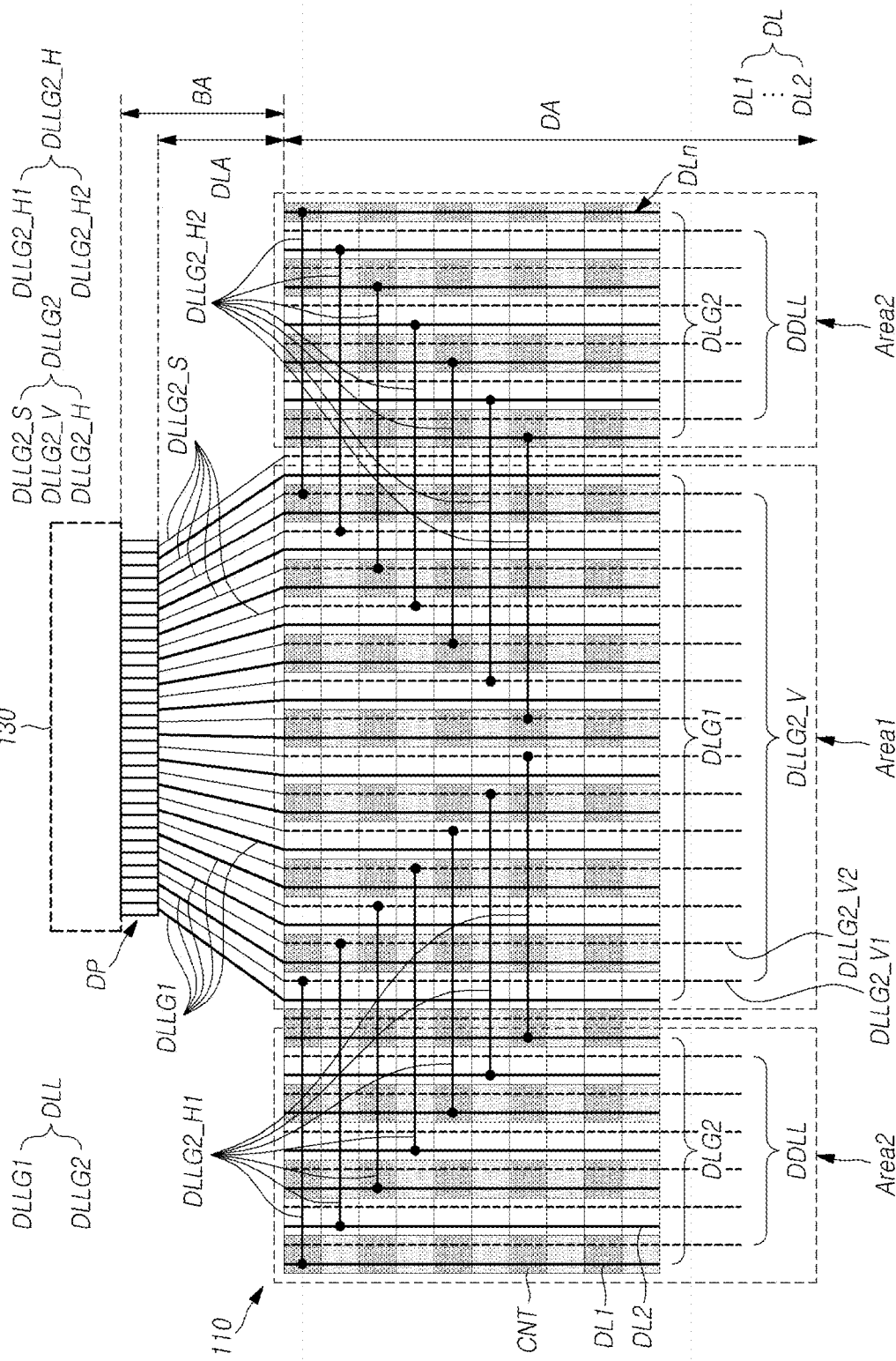
FIG. 12 is a plan view illustrating a structure of a display panel having a different arrangement structure of horizontal (2-3)th data link lines in a display device according to embodiments of the present disclosure.

FIG. 12 is a plan view illustrating a structure of a display panel having a different arrangement structure of horizontal (2-3)th data link lines in a display device according to embodiments of the present disclosure.

Referring to FIG. 12, the display panel 110 according to the present disclosure may be divided into a display area DA on which images are displayed and a bezel area BA outside the display area DA and on which no images are displayed.

A plurality of data lines DL extending in a first direction (e.g., a column direction) to receive data signals output from the data driving circuit 130 may be disposed in the display area DA. A plurality of gate lines (GL in FIG. 4) extending in a second direction (e.g., a row direction) to receive gate signals output from the gate driving circuit 120 may be disposed in the display area DA. A plurality of subpixels (SP in FIG. 4) may be formed in areas in which the gate lines (GL in FIG. 4) intersect the data lines DL.

The plurality of data lines DL may include a first data line group DLG1 disposed in a first area Area1 corresponding to the data driving circuit 130 and a second data line group DLG2 disposed in second areas Area2 located on outside of the first area Area1.

In the display device 100 according to the present disclosure, the first data line group DLG1 disposed in the first area Area1 corresponding to the data driving circuit 130 is connected to a first data link line group DLLG1 having a linear structure and the second data line group DLG2 disposed in the second areas Area2 located on outside of the first area Area1 is connected to a second data link line group DLLG2 having a bending structure in order to form the area in which the data driving circuit 130 is located into a narrow bezel.

The first area Area1 corresponding to the data driving circuit 130 is an area of the display area DA of the display panel 110 corresponding to the width of the data driving circuit 130. Since the first area Area1 corresponds to the data driving circuit 130 in the first direction (e.g., a column direction), the first data line group DLG1 disposed in the first area Area1 may be connected to the data driving circuit 130 using the first data link line group DLLG1 having a linear structure.

The first data link line group DLLG1 extends from the data driving circuit 130 and is connected to the first data line group DLG1 of the first area Area1 corresponding to the data driving circuit 130. Thus, the first data link line group DLLG1 may be located in the data link area DLA.

The second areas Area2 located on outside of the first area Area1 correspond to portions of the display area DA disposed on both sides of the first area Area1. The display device 100 according to the present disclosure includes the second data link line group DLLG2 having a bending structure and connecting the second data line group DLG2 disposed in the second areas Area2 to the data driving circuit 130.

The second data line group DLLG2 may include straight (2-1)th data link lines DLLG2_S, vertical (2-2)th data link lines DLLG2_V, and horizontal (2-3)th data link lines DLLG2_H to connect the second data line group DLG2 of the second areas Area2 located on outside of the first area Area1.

The straight (2-1)th data link lines DLLG2_S extend from the data pad part DP connected to the data driving circuit 130 to the first area Area1 corresponding to the data driving circuit 130.

The vertical (2-2)th data link lines DLLG2_V are disposed in the first direction (e.g., a column direction) to be in parallel to the first data line group DLG1 of the first area Area1 corresponding to the data driving circuit 130. The vertical (2-2)th data link lines DLLG2_V are formed in the display area DA. Here, the vertical (2-2)th data link lines DLLG2_V may be disposed to alternate with data lines of the first data line group DLG1.

The straight (2-1)th data link lines DLLG2_S extend in the first direction (e.g., a column direction) and are connected to the vertical (2-2)th data link lines DLLG2_V in the first area Area1 corresponding to the data driving circuit 130.

The horizontal (2-3)th data link lines DLLG2_H extend in the second direction (e.g., a row direction) and are connected to the second data line group DLG2 of the second areas Area2 located on outside of the first area Area1. The horizontal (2-3)th data link lines DLLG2_H may be formed in the display area DA.

The second data line group DLG2 of the second areas Area2 located on outside of the first area Area1 may be connected to the vertical (2-2)th data link lines DLLG2_V disposed in parallel to the first data line group DLG1, connected to the straight (2-1)th data link lines DLLG2_S extending from the data pad part DP, and connected to the data driving circuit 130 through the horizontal (2-3)th data link lines DLLG2_H extending in the second direction (e.g., a row direction).

In the display device 100 of the present disclosure, the horizontal (2-3)th data link line DLLG2_H may have the same length in order to reduce parasitic capacitance formed between the horizontal (2-3)th data link line DLLG2_H and another signal line.

For example, the leftmost outer data line DL1 among the second data line group DLG2 disposed in the second area Area2 is connected to the leftmost (2-2)th data link line DLLG2_V1 among the vertical (2-2)th data link lines DLLG2_V disposed in the first area Area1.

In addition, the second data line DL2 disposed from the left side among the second data line group DLG2 disposed in the second area Area2 is connected to the second (2-2)th data link line DLLG2_V2 disposed from the left side among the vertical (2-2)th data link lines DLLG2_V located in the first area Area1.

As described above, when the horizontal (2-3)th data link lines DLLG2_H connecting the second data line group DLG2 disposed in the second area Area2 and the vertical (2-2)th data link lines DLLG2_V located in the first area Area1 have the same length, parasitic capacitance formed between the horizontal (2-3)th data link lines DLLG2_H and other signal lines may be reduced.

At this time, the horizontal (2-3)th data link lines DLLG2_H connecting between the second data line group DLG2 disposed in the second area Area2 and the vertical (2-2)th data link lines DLLG2_V located in the first area Area1 may be disposed in the center of the display panel 110 as it moves away from the data driving circuit 130.

In addition, the structure in which the horizontal (2-3)th data link lines DLLG2_H are formed to have the same length may be applied to not only the left second area Area2 of the display panel 110 but also the right second area Area2 of the display panel 110.

At this time, it is preferable that the structure of the horizontal (2-3)th data link lines DLLG2_H1 arranged in the left second area Area2 of the display panel 110 is symmetrical with the structure of the horizontal (2-3)th data link lines DLLG2_H2 arranged in the right second area Area2 of the display panel 110 with respect to the center of the display panel 110.

The horizontal (2-3)th data link lines DLLG2_H may be connected to the vertical (2-2)th data link lines DLLG2_V and the second data line group DLG2 through contact holes. In addition, the horizontal (2-3)th data link lines DLLG2_H may be formed on a different layer from the vertical (2-2)th data link lines DLLG2_V and the second data line group DLG2.

As described above, when connecting the second data line group DLG2 of the second area Area2 located on outside of the first area Area1 through the second data link line group DLLG2 having a bent structure, parasitic capacitance formed between the horizontal (2-3)th data link lines DLLG2_H and other signal lines may be reduced by forming the horizontal (2-3)th data link lines DLLG2_H connecting the second data line group DLG2 disposed in the second area Area2 and the vertical (2-2)th data link lines DLLG2_V located in the first area Area1 with the same length.

The above-described embodiments the of present disclosure will be briefly reviewed as follows.

A display device according to embodiments of the present disclosure may comprise a display panel including a plurality of subpixels, a plurality of data lines, and a plurality of gate lines, a data driving circuit configured to supply a plurality of data voltages to the plurality of data lines, a gate driving circuit configured to supply a plurality of gate signals to the plurality of gate lines, a timing controller configured to control the data driving circuit and the gate driving circuit, wherein the display panel includes a first data link line group with a linear structure connecting to a first data line group disposed in a first area corresponding to the data driving circuit among the plurality of data lines, and a second data link line group with a bending structure connecting to a second data line group disposed in a second area located on outside of the first area among the plurality of data lines through (2-3)th data link lines with same length.

The first data link line group is connected between the data driving circuit and the first data line group in straight lines.

The second data link line group having a bending structure includes (2-1)th data link lines extending from the data driving circuit to the first area Area1, (2-2)th data link lines disposed in the first area and connected to the (2-1)th data link lines, and the (2-3)th data link lines connecting the (2-2)th data link lines and the second data line group.

The (2-1)th data link lines are disposed in a bezel area.

The (2-2)th data link lines are disposed in parallel to the first data line group in the first area.

The (2-3)th data link line are arranged toward an outer direction of the display panel as a distance from the data driving circuit increases.

The (2-3)th data link line are arranged toward a central direction of the display panel as a distance from the data driving circuit increases.

The (2-3)th data link lines include a part of the (2-3)th data link lines disposed in the second area on a left side of the display panel and a part of the (2-3)th data link lines disposed in the second area on the right side of the display panel formed to be symmetrical based on a center of the display panel.

The (2-3)th data link lines are formed on a layer different from the second data line group.

The display device further includes dummy data link lines disposed between each of the second data line group in the second area.

A display panel according to embodiments of the present disclosure may comprise a plurality of subpixels, a plurality of data lines comprising a first data line group disposed in a first area corresponding to a data driving circuit and a second data line group disposed in a second area located on outside of the first area, a plurality of gate lines, a first data link line group having a linear structure connected to the first data line group and disposed in a bezel area, and a second data link line group having a bending structure in which (2-3)th data link lines having the same length are connected to the second data line group through a display area.

It will be apparent to those skilled in the art that various modifications and variations can be made in the display device and the display panel of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
   a display panel including a plurality of subpixels, a plurality of data lines, and a plurality of gate lines;
   a data driving circuit configured to supply a plurality of data voltages to the plurality of data lines;
   a gate driving circuit configured to supply a plurality of gate signals to the plurality of gate lines;
   a timing controller configured to control the data driving circuit and the gate driving circuit;
   wherein the display panel includes:
   a first data link line group with a linear structure connected to a first data line group disposed in a first area corresponding to the data driving circuit among the plurality of data lines; and
   a second data link line group with a bending structure connected to a second data line group disposed in a second area located on outside of the first area among the plurality of data lines through second data link lines,
   wherein the second data link lines include:
   second-first data link lines extending from the data driving circuit to the first area;
   second-second data link lines disposed in the first area and connected to the second-first data link lines; and
   second-third data link lines connecting the second-second data link lines and the second data line group,
   wherein all of the second-second data link lines have at least a length corresponding to a length of each of first data lines included in the first data line group disposed in the first area.

2. The display device according to claim 1, wherein the first data link line group is connected between the data driving circuit and the first data line group in straight lines.

3. The display device according to claim 1, wherein the second-first data link lines are disposed in a bezel area of the display panel.

4. The display device according to claim 3, wherein the second-second data link lines are disposed in parallel to the first data line group in the first area.

5. The display device according to claim 1, wherein the second-third data link lines are arranged toward an outer direction of the display panel as a distance from the data driving circuit increases.

6. The display device according to claim 1, wherein the second-third data link lines are arranged toward a central direction of the display panel as a distance from the data driving circuit increases.

7. The display device according to claim 1, wherein the second-third data link lines include a part of the second-third data link lines disposed in the second area on a left side of the display panel and a part of the second-third data link lines disposed in the second area on a right side of the display panel formed to be symmetrical based on a center of the display panel.

8. The display device according to claim 1, wherein the second-third data link lines are formed on a layer different from the second data line group.

9. The display device according to claim 1, further includes dummy data link lines disposed between each of the second data line group in the second area.

10. The display device according to claim 3, wherein the second-second data link lines are disposed to alternate with the first data line group in the first area.

11. The display device according to claim 1, further comprising: dummy data link lines disposed between respective adjacent second data lines among second data lines included in the second data line group in the second area,
    wherein at least one of the dummy data link lines has at least a length corresponding to a length of each of the second data lines located in the second area.

12. A display panel comprising:
    a plurality of subpixels;
    a plurality of data lines comprising a first data line group disposed in a first area corresponding to a data driving circuit and a second data line group disposed in a second area located on outside of the first area, and receiving a plurality of data voltages from the data driving circuit;
    a plurality of gate lines;
    a first data link line group having a linear structure connected to the first data line group and disposed in a bezel area; and
    a second data link line group having a bending structure in which second data link lines are connected to the second data line group through a display area,
    wherein the second data link lines include:
    second-first data link lines extending from the data driving circuit to the first area;
    second-second data link lines disposed in the first area and connected to the second-first data link lines; and
    second-third data link lines connecting the second-second data link lines and the second data line group,
    wherein all of the second-second data link lines have at least a length corresponding to a length of each of first data lines included in the first data line group disposed in the first area.

13. The display panel according to claim 12, wherein the first data link line group is connected between the data driving circuit and the first data line group in straight lines.

14. The display panel according to claim 12, wherein the second-first data link lines are disposed in the bezel area.

15. The display panel according to claim 14, wherein the second-second data link lines are disposed in parallel to the first data line group in the first area.

16. The display panel according to claim 12, wherein the second-third data link lines are arranged toward an outer direction of the display panel as a distance from the data driving circuit increases.

17. The display panel according to claim 12, wherein the second-third data link lines are arranged toward a central direction of the display panel as a distance from the data driving circuit increases.

18. The display panel according to claim 12, wherein the second-third data link lines include a part of the second-third data link lines disposed in the second area on a left side of the display panel and a part of the second-third data link lines disposed in the second area on a right side of the display panel formed to be symmetrical based on a center of the display panel.

19. The display panel according to claim 12, wherein the second-third data link lines are formed on a layer different from the second data line group.

20. The display panel according to claim 12, further includes dummy data link lines disposed between each of the second data line group in the second area.

21. The display panel according to claim 12, wherein the second-second data link lines are disposed to alternate with the first data line group in the first area.

22. A display device comprising:
- a display panel including a plurality of subpixels, a plurality of data lines, and a plurality of gate lines;
- a data driving circuit configured to supply a plurality of data voltages to the plurality of data lines;
- a gate driving circuit configured to supply a plurality of gate signals to the plurality of gate lines;
- a timing controller configured to control the data driving circuit and the gate driving circuit;

wherein the display panel includes:

a first data link line group with a linear structure connecting to a first data line group disposed in a first area corresponding to the data driving circuit among the plurality of data lines; and a second data link line group connecting to a second data line group disposed in a second area located on outside of the first area among the plurality of data lines, the second data link line group comprising first data link lines disposed in a first direction in the first area and second data link lines extending in a second direction perpendicular to the first direction with same length, wherein all of the second data link lines have at least a length corresponding to a length of each of first data lines included in the first data line group disposed in the first area.

\* \* \* \* \*